(12) United States Patent
Fiolka et al.

(10) Patent No.: US 7,817,250 B2
(45) Date of Patent: Oct. 19, 2010

(54) MICROLITHOGRAPHIC PROJECTION EXPOSURE APPARATUS

(75) Inventors: Damian Fiolka, Oberkochen (DE);
Michael Totzeck, Schwaebisch Gmuend (DE); Alexandra Pazidis,
Essingen-Lautenburg (DE); Michael Ricker, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 132 days.

(21) Appl. No.: 12/146,200

(22) Filed: Jun. 25, 2008

(65) Prior Publication Data

US 2009/0021719 A1 Jan. 22, 2009

Related U.S. Application Data

(60) Provisional application No. 60/950,366, filed on Jul. 18, 2007.

(30) Foreign Application Priority Data

Jul. 18, 2007 (DE) .................. 10 2007 033 773

(51) Int. Cl.
*G03B 27/72* (2006.01)
*G03B 27/54* (2006.01)

(52) U.S. Cl. .......................... 355/71; 355/67

(58) Field of Classification Search .............. 355/52, 355/53, 55, 67–71; 250/548; 356/399–401; 359/501, 726
See application file for complete search history.

(56) References Cited

U.S. PATENT DOCUMENTS

| | | | |
|---|---|---|---|
| 6,466,303 B1 | 10/2002 | Omura et al. | |
| 6,774,984 B2 | 8/2004 | Gerhard et al. | |
| 7,027,235 B2 | 4/2006 | Koehler et al. | |
| 7,053,988 B2 * | 5/2006 | Totzeck et al. | ........ 355/71 |
| 7,206,060 B2 * | 4/2007 | Mori | ........ 355/71 |
| 7,511,886 B2 * | 3/2009 | Schultz et al. | ........ 359/489 |
| 2005/0152046 A1 | 7/2005 | Gruner et al. | |

FOREIGN PATENT DOCUMENTS

| | | |
|---|---|---|
| EP | 1 840 945 | 10/2007 |
| WO | WO 2005/031467 | 4/2005 |
| WO | WO 2005/050325 | 6/2005 |
| WO | WO 2006/077849 | 7/2006 |

\* cited by examiner

*Primary Examiner*—Hung Henry Nguyen
(74) *Attorney, Agent, or Firm*—Fish & Richardson P.C.

(57) ABSTRACT

The disclosure relates to a microlithographic projection exposure apparatus, as well as related components and methods. In some embodiments, a microlithographic projection exposure apparatus includes an illumination system and a projection objective, where the illumination system can illuminate an object plane of the projection objective and the projection objective can produce the image of the object plane on an image plane. A polarization-dependent transmission can be produced in the illumination system such that, for at least one polarization distribution in respect of the light impinging on the object plane, a non-homogeneous intensity distribution in the object plane is obtained. The non-homogeneous intensity distribution can afford a homogeneous intensity distribution in the image plane by virtue of polarization-dependent transmission properties of the projection objective.

34 Claims, 12 Drawing Sheets

Angle of incidence in the x-direction

Angle of incidence in the x-direction a)

b)

State of the art a)

b)

c)

MICROLITHOGRAPHIC PROJECTION EXPOSURE APPARATUS

CROSS-REFERENCE TO RELATED APPLICATIONS

This application claims priority under 35 U.S.C. §119(e)(1) to U.S. Provisional Application No. 60/950,366, filed on Jul. 18, 2007. This applications also claims priority under 35 U.S.C. §119 to German Patent Application DE 10 2007 033 733.8, filed Jul. 18, 2007. The content of both of these applications are hereby incorporated by reference.

FIELD

The disclosure concerns a microlithographic projection exposure apparatus, as well as related components and methods.

BACKGROUND

Microlithography is used for the production of microstructured components such as for example integrated circuits or LCDs. The microlithography process is carried out in what is referred to as a projection exposure apparatus having an illumination system and a projection objective. The image of a mask (commonly referred to as a reticle) illuminated via the illumination system is in that case projected via the projective objective on to a substrate (for example a silicon wafer) which is coated with a light-sensitive layer (photoresist) and arranged in the image plane of the projection objective in order to transfer the mask structure on to the light-sensitive layer of the substrate.

To enhance imaging contrast, given polarization distributions can be specifically adjusted in the reticle plane in the illumination system. But, the intensity distribution in the plane of the wafer can undesirably change depending on the polarization distribution which is set in the illumination system, that is to say which is obtained in the object plane of the projection objective. This can be due to transmission properties of the projection objective that are polarization-dependent. The known effect of polarization-dependent transmission is referred to as transmission separation or 'diattenuation'. The effect is caused by the polarization-dependent transmission of anti-reflection layers provided on the lenses (AR-layers) and highly reflecting layers present on some mirrors (HR-layers) in the projection objective. Thus as is known for an AR-layer $T_p$ is greater than $T_s$, wherein $T_p$ is the degree of transmission for the p-component with the vibration direction of the electrical field strength vector parallel to the plane of incidence and $T_s$ denotes the degree of transmission for the s-component with the vibration direction of the electrical field strength vector perpendicular to the plane of incidence.

To demonstrate the problem, FIGS. 15a-c show diagrammatic views illustrating the position-dependent configuration, respectively obtained in the wafer plane of a projection objective 5, of the scanned intensity (curves $A_2$, $B_2$ and $C_2$) depending on the polarization distribution set in the reticle plane or the object plane of the projection objective 5. In that respect, all three cases are based on the assumption of a homogeneous intensity distribution in the reticle plane (curves $A_1$, $B_1$ and $C_1$), in which respect however unpolarized light is set in the reticle plane as shown in FIG. 15a, polarized light is set in the reticle plane, with a radial polarization distribution, as shown in FIG. 15b, and a tangential polarization distribution is set in the reticle plane as shown in FIG. 15c.

The term 'tangential polarization' is used to denote a polarization distribution in which the vibration planes of the electrical field strength vectors of the individual, linearly polarized light beams are oriented approximately perpendicularly to the radius directed on to the optical axis. In contrast the term 'radial polarization' is used to denote a polarization distribution in which the vibration planes of the electrical field strength vectors of the individual, linearly polarized light beams are oriented approximately radially with respect to the optical axis.

A comparison of the curves $A_2$, $B_2$ and $C_2$ in FIG. 15a, FIG. 15b and FIG. 15c shows that, in spite of the homogeneous intensity distribution respectively present in the reticle plane, a homogeneous intensity distribution is also afforded in the wafer plane only for the unpolarized illumination mode of FIG. 15a whereas the polarization-dependent transmission of the projection objective 5, as shown in FIGS. 15b and 15c, leads to intensity distributions which respectively locally vary in the wafer plane and which are also different from each other.

SUMMARY

In some embodiments, the disclosure provides a microlithographic projection exposure apparatus in which an unwanted change in the intensity distribution achieved in the wafer plane is reduced (e.g., minimized) in dependence on the polarization distribution set in the illumination system.

In certain embodiments, the disclosure features a microlithographic projection exposure apparatus that includes an illumination system and a projection objective,
  wherein the illumination system in operation of the projection exposure apparatus illuminates an object plane of the projection objective and the projection objective produces the image of the object plane on an image plane; and
  wherein a polarization-dependent transmission is produced or provided in the illumination system such that, for at least one polarization distribution in respect of the light impinging on the object plane, a non-homogeneous intensity distribution in the object plane is obtained, wherein the non-homogeneous intensity distribution affords a homogeneous intensity distribution in the image plane by virtue of polarization-dependent transmission properties of the projection objective.

The intensity distribution in the image plane can be considered homogeneous if a value of less than 4% is given for what is referred to as the PV-value ('peak-to-value' value) in respect of the scanned intensity in the image plane. In some embodiments, the PV-value is less than 2% (e.g., less than 0.5%). The PV-value of an intensity distribution is defined as the difference between maximum and minimum intensity ($PV=I_{max}-I_{min}$). A PV-value of PV=4% corresponds to a value of 'uniformity' of U=2%, wherein uniformity U is defined as $U=(I_{max}-I_{min})/(I_{max}+I_{min})$ and wherein it is presupposed that the intensity maximum and the intensity minimum after standardisation are symmetrical relative to the value one (or 100%).

Adjustment of a homogeneous intensity distribution in the image plane and also the foregoing values of the PV-value or uniformity for characterizing the homogeneity of intensity distribution, which is set in the image plane, relate in each case to the behaviour of the projection exposure apparatus without a reticle fitted in the projection exposure apparatus.

In certain embodiments, the disclosure features a microlithographic projection exposure apparatus that includes an illumination system and a projection objective;

wherein the illumination system in operation of the projection exposure apparatus illuminates an object plane of the projection objective and the projection objective produces the image of the object plane on an image plane; and wherein there is provided at least one correction element which has a polarization-sensitive transmission characteristic and which produces or provides a polarization-dependent transmission such that for at least one polarization distribution of the light impinging on the object plane, a disturbance present without the correction element in the intensity distribution obtained in the image plane is at least partially corrected.

The disclosure is based, at least in part, on the concept, in a projection exposure apparatus, of correcting the effect of an existing unwanted characteristic of or disturbance in the polarization properties on the imaging result obtained in the photoresist, such as the presence of polarization-induced intensity defects. In some embodiments, this is achieved using one or more correction elements that set a defined intensity configuration. In particular, the intensity distribution in the reticle plane can be deliberately 'detuned' in order to obtain a homogeneous intensity distribution in the image plane (that is to say on the photoresist-coated wafer).

In some embodiments, the disclosure involves the concept of considering the illumination system and the projection objective, with respect to their polarization-sensitive optical elements and the diattenuation caused thereby, not separately from each other but as forming a unit with each other. Therefore, instead for example of implementing separate or independent compensation of the polarization-dependent transmission properties ('diattenuation') in the imaging system and setting a homogeneous intensity distribution in the reticle plane for a given illumination setting or a given polarization distribution, a non-homogeneous intensity distribution is produced in the image plane of the projection objective specifically and deliberately by the totality of the polarization-sensitive optical elements of the illumination system. That non-homogeneous intensity distribution then becomes the—ultimately relevant—homogeneous intensity distribution in the image plane of the projection objective, only by virtue of the diattenuation which additionally occurs in the projection objective. In that respect a certain loss in intensity is possibly also tolerated as optimization is effected for the above-mentioned polarization-dependent transmission characteristic and not maximum transmission.

Due to the presence of one or more elements being sensitive or adapted to the polarization state (or correction elements in order to correct a polarization-dependent disturbance of the intensity distribution) it is also possible to realize shorter response times or switching times, since a residual correction, if given, to be provided by a device changing the field variation of the intensity, is reduced.

In some embodiments the illumination system and the projection objective each have at least one polarization-sensitive optical element with a polarization-dependent transmission and/or reflection characteristic, wherein the totality of the polarization-sensitive optical elements of the illumination system and the totality of the polarization-sensitive optical elements of the projection objective have mutually inverse diattenuations.

In certain embodiments therefore the illumination system and the projection objective each have at least one polarization-sensitive optical element with a polarization-dependent transmission and/or reflection characteristic, wherein the totality of the polarization-sensitive optical elements of the illumination system and the totality of the polarization-sensitive optical elements of the projection objective have mutually coincident diattenuations.

An optical element can be arranged between the illumination system and the projection objective, which element causes an effective rotation of the preferred polarization direction in respect of linearly polarized light passing therethrough through $90°±3°$.

A substantial advantage can be that, after matching of the illumination system and the projection objective to each other, upon a subsequent change in the illumination setting or the polarization distribution in the illumination system, for example from radial polarization to tangential polarization, the desired homogeneous intensity distribution in the wafer plane can be automatically retained without additional manipulation operations or measures to be implemented, as the oppositeness of the totality of the polarization-sensitive optical elements of the illumination system on the one hand and the totality of the polarization-sensitive optical elements of the projection objective on the other hand, in respect of diattenuation, can still be maintained.

In some embodiments, the illumination system has an optical axis and a correction element with at least one plane plate arranged tilted in relation to the optical axis. In some embodiments, the plane plate has a transmission characteristic dependent on the polarization state and the angle of incidence of the radiation passing therethrough.

In certain embodiments in operation of the projection exposure apparatus a substrate disposed in the image plane is movable in a predetermined scanning direction relative to the projection objective, wherein an axis of rotation about which the at least one plane plate is tilted relative to the optical axis extends parallel to the scanning direction.

By a plane plate which is tilted in that way, it is possible to correct a polarization-induced, linearly positionally dependent configuration of the intensity in the wafer plane, as occurs in particular when using polarized illumination settings in the illumination system.

In some embodiments the plane plate has a dielectric coating, by which, while maintaining the desired dependency of the transmission characteristic of the plane plate on polarization and angle of incidence of the light passing therethrough, the effective transmission losses can be minimized by suitably setting the transmission characteristics for s- and p-polarized light.

In certain embodiments the correction element has a plurality of plane plates. In some embodiments, those plane plates are adjustable independently of each other in respect of their tilt angle relative to the optical axis. Such an arrangement can be advantageous, for example, because of the generally limited structural space as, because of the compact nature of the individual plane plates, relatively large placement angles can be set without a large structural space being desired for that purpose for the correction element in the light propagation direction or along the optical axis.

In certain embodiments matching of the polarization-sensitive optical elements of the illumination system on the one hand and the projection objective on the other hand is effected with the inclusion of the light-sensitive layer (that is to say the photoresist) with which the substrate arranged in the image plane of the projection objective is coated. That photoresist can introduce only an offset and no field dependency in respect of an intensity distribution which is already homogeneously set in the case of an also homogeneous polarization distribution. In the case of a locally varying polarization distribution in respect of the light incident on the photoresist however the reflection characteristic of the photoresist—which is polarization-dependent in accordance with the Fresnel formula—can make a field-dependent contribution for the photoresist to transmission distribution and thus a local variation in the reactions caused by the light in the photoresist.

In that respect the above-described action of the photoresist can be taken into consideration for example in such a way that the sensor which is used for determining the homogeneity of intensity distribution in the wafer plane and which is also referred to as a 'spot sensor' and which has a light entrance opening (e.g., a pinhole), a UV converter for converting UV light into visible light and a photodiode for receiving the visible light is already designed from the outset in such a way that it simulates a polarization-dependent transmission of the photoresist ('diattenuation'), which for example can be embodied by a suitable design of dielectric elements present in that sensor, for example in the photodiode or the glass plate of the UV converter. When setting the intensity distribution in accordance with the signal from such a spot sensor simulating the photoresist therefore, the light contributing to the imaging action has a homogeneous intensity distribution, when the effects occurring in the photoresist are included.

In some embodiments the illumination system has at least one deflection mirror provided with an HR-layer. That deflection mirror can be arranged at least in the immediate proximity of a pupil plane. In that case different angles on the deflection mirror correspond to different locations in a field plane, that is to say in particular the reticle plane. An angular dependency of reflectivity of the deflection mirror can thus be transformed into a desired field dependency in order in that way to provide a suitable allowance for the field dependency of the projection objective.

In certain embodiments the illumination system has an optical axis and illuminates a rectangular reticle field in the object plane of the projection objective, wherein the longitudinal axis of the rectangular reticle field is arranged perpendicularly relative to an axis of rotation about which the deflection mirror is tilted relative to the optical axis. That arrangement can have the advantage of stronger matchability to the transmission properties of the projection objective as a result of a greater variation in the angle of incidence of the light reflected by the deflection mirror so that the layer design selected for the HR-layer of the deflection mirror can also involve a comparatively low degree of complexity.

In some embodiments at least one lens in the illumination system and/or the projection objective is provided with an anti-reflecting coating (AR-layer), for which $T_s$ is greater than $T_p$, wherein $T_p$ denotes the degree of transmission for the p-component and $T_s$ denotes the degree of transmission for the s-component of light impinging on the coating. If the lens in question is provided with the diattenuation, for example in the illumination system, which differs from the usual behaviour of an AR-layer, it is possible in that way to achieve for example compensation of the diattenuation of a lens provided in the projection objective, which are achieved with an AR-layer involving usual diattenuation (that is to say with $T_s$ less than $T_p$), and vice-versa.

Further configurations of the disclosure are set forth in the description and the appendant claims.

The disclosure is described in greater detail hereinafter via embodiments by way of example illustrated in the accompanying drawings.

DETAILED DESCRIPTION

Hereinafter the concept according to the disclosure is first described with reference to the diagrammatic views in FIGS. 1a-c.

Figure 1:
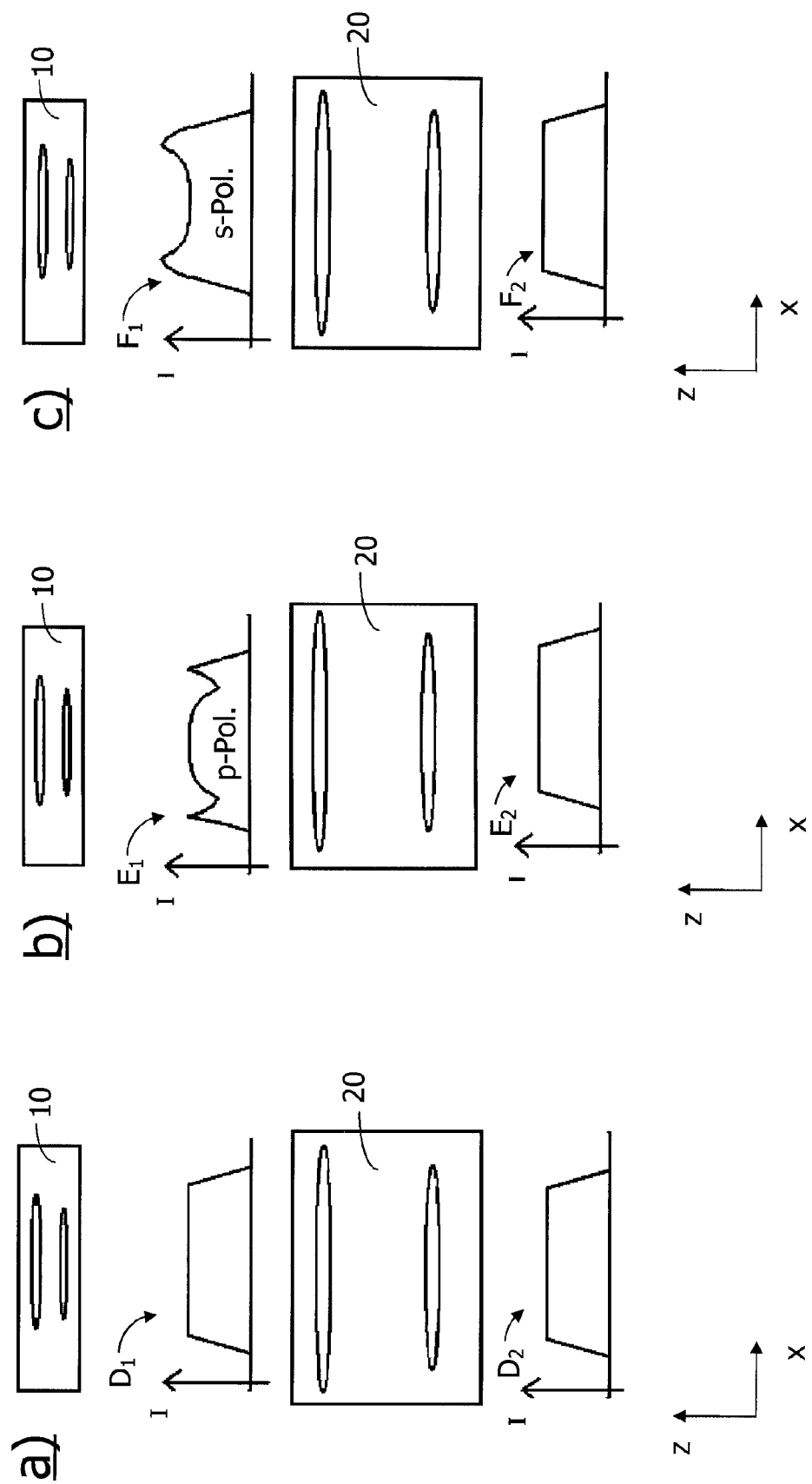
FIGS. 1a-c show diagrammatic views of local intensity configurations, which are set in the reticle plane of a microlithographic projection exposure apparatus or which are obtained in the wafer plane respectively, for different polarization distributions, to explain a general concept of the disclosure.

FIGS. 1a-c, in each of which an illumination system 10 and a projection objective 20 of a microlithographic projection exposure apparatus are diagrammatically indicated, diagrammatically shows the positionally dependent intensity configuration in the reticle plane and the object plane respectively of the projection objective 20 (curves $D_1$, $E_1$, and $F_1$) and the positionally dependent configuration, which occurs in the wafer plane and the image plane respectively of the projection objective 20, of the scanned intensity (curves $D_2$, $E_2$ and $F_2$). In that respect FIGS. 1a-c firstly differ in particular by the polarization distribution in the reticle plane, in which respect specifically as shown in FIG. 1a there is unpolarized light in the reticle plane, as shown in FIG. 1b there is radially polarized light in the reticle plane, and as shown in FIG. 1c there is tangentially polarized light in the reticle plane.

Furthermore the intensity distributions set in FIG. 1a, FIG. 1b and FIG. 1c respectively in the reticle plane differ as more specifically a homogeneous intensity distribution is set in the reticle plane (curve $D_1$), only for the situation of unpolarized illumination (FIG. 1a). In contrast the illumination system 10 is so designed that intensity configurations which vary in dependence on position over the reticle plane (curves $E_1$ and $F_1$ respectively) are produced for the polarization distributions different from the unpolarized state, in the reticle plane. That local variation in intensity distribution is caused by the totality of the polarization-sensitive optical elements in the illumination system 10, that is to say in particular the AR-layers on the lenses and the HR-layers on the mirrors.

The projection objective 20 also includes polarization-sensitive optical elements in particular in the form of AR- and/or HR-layers which determine the positionally dependent intensity configuration occurring in the wafer plane of the projection objective 20.

As can be seen from each of FIGS. 1b and 1c the intensity distribution obtained in the wafer plane is homogeneous in each case (curves $E_2$ and $F_2$ respectively). That is achieved by virtue of the fact that the polarization-dependent transmission properties, in respect of the local variation in the intensity in the reticle plane or the wafer plane respectively for the illumination system on the one hand and the projection objective on the other hand, are precisely in opposite relationship and therefore cancel each other out. In accordance with the disclosure that is achieved by suitable matching of the polarization-sensitive optical elements (in particular AR-layers and HR-layers respectively) in the illumination system to the totality of the polarization-sensitive optical elements in the projection objective, as is described in greater detail hereinafter.

Figure 2:
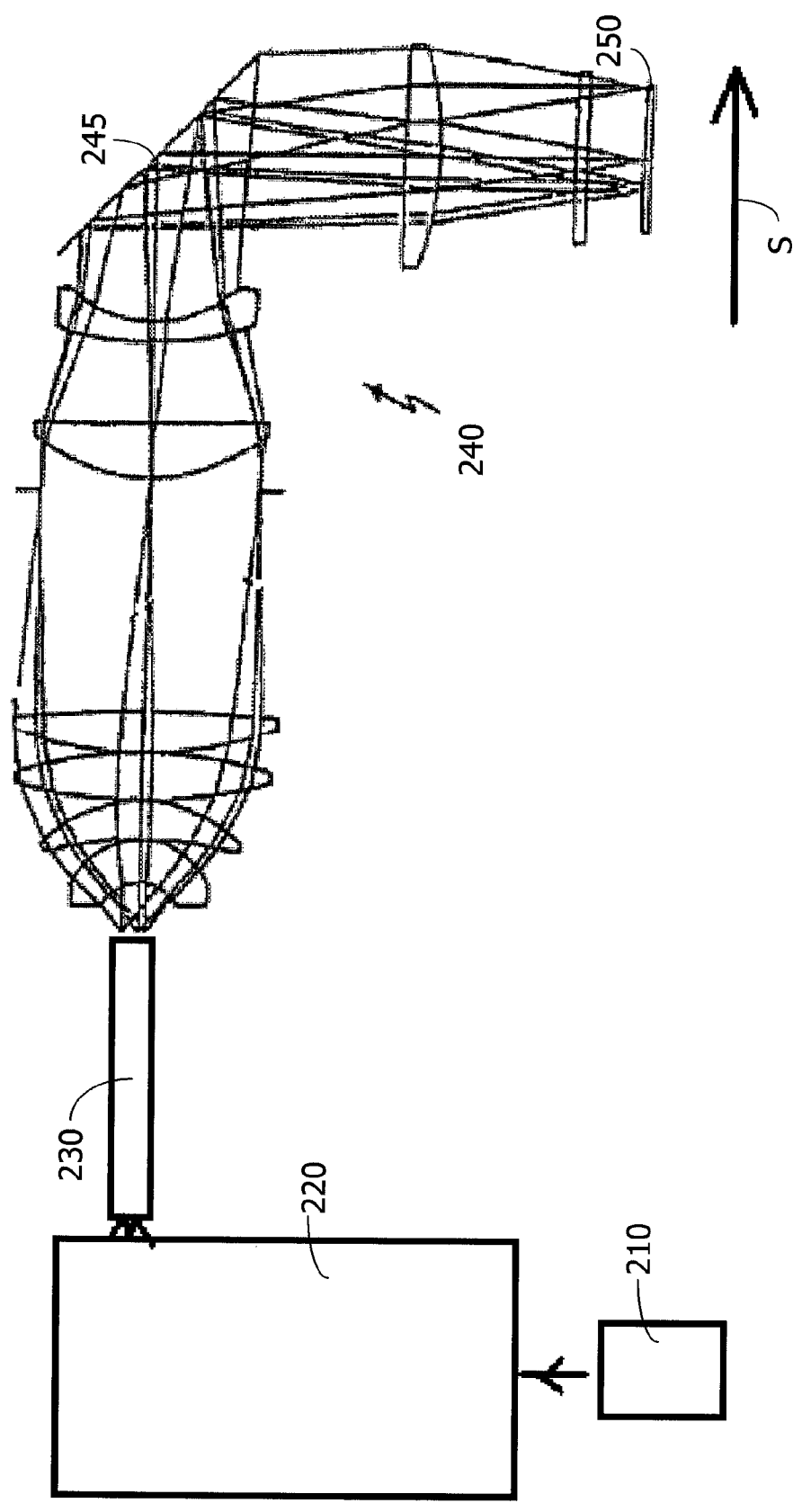
FIG. 2 shows a diagrammatic view of the structure of an illumination system.

FIG. 2 shows—as a simplified view of the known structure of an illumination system—a light source 210, a zoom axicon system 220 and a light integrator bar 230, behind which there is a field plane with a reticle masking system (REMA) (not shown), the image of which is produced on a mask (reticle) 250 disposed in the reticle plane, by a REMA objective 240 which follows in the light propagation direction. A constituent part of the REMA objective 240 is in particular a deflection mirror 245 provided with a polarization-sensitive HR-layer.

Figure 4:
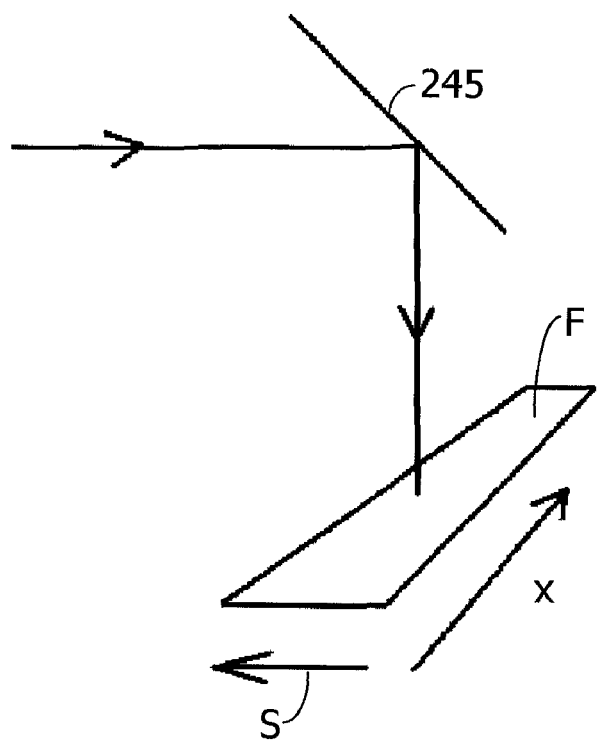
FIG. 4 shows a diagrammatic view to explain a relative arrangement of the deflection mirror and the reticle field in the illumination system of FIG. 2.

As diagrammatically indicated in FIG. 2, the longitudinal axis of the rectangular reticle field F (x-direction) extends parallel to the axis of rotation about which the deflection mirror 245 is tilted or rotated relative to the optical axis of the illumination system. The scanning direction here extends perpendicularly to the longitudinal axis of the rectangular reticle field F, that is to say in the y-direction. In this case, the lenses in front of and after the deflection mirror 245 have been omitted from FIG. 4 for simplification purposes as here it is only the relative position of the deflection mirror 245 with respect to the reticle field F that is to be considered.

Figure 3:
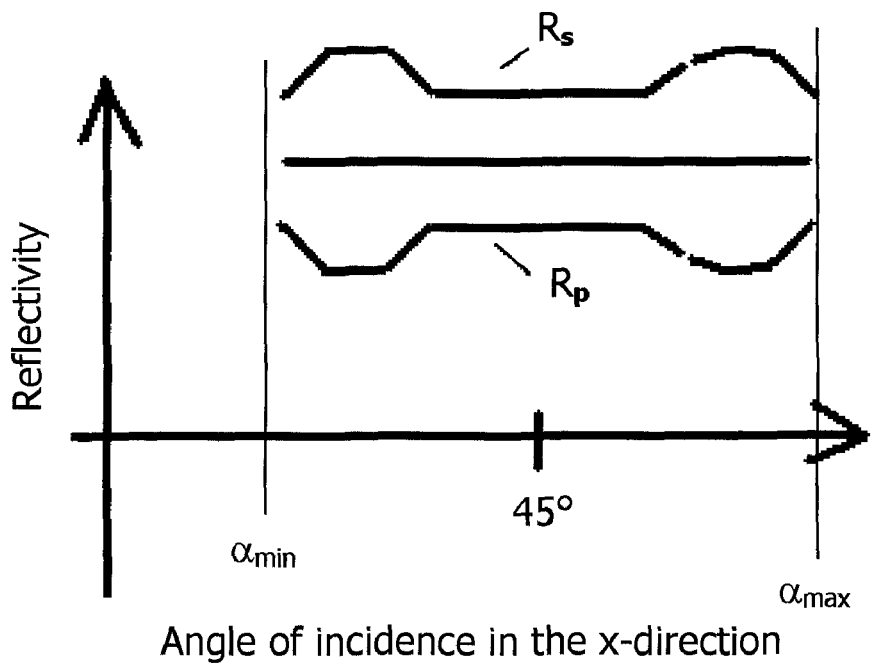
FIG. 3 shows a graph illustrating a typical incidence angle dependency of the reflectivity of the deflection mirror in the illumination system of FIG. 2.

A configuration by way of example of the reflectivity occurring on the deflection mirror 245 as a function of the angle of incidence α in the x-direction is shown in FIG. 3. In that respect $R_s$ denotes the reflectivity for s-polarized light and $R_p$ denotes the reflectivity for p-polarized light. $R_s$ and $R_p$ are of a complementary configuration in dependence on the angle of incidence, except for a constant offset.

The HR-layer on the deflection mirror 245 is now so designed for matching the polarization-dependent transmission characteristic of the illumination system to that of the projection objective that the polarization-dependent transmission curve of the illumination system over the reticle plane and the polarization-dependent transmission curve of the projection objective over the wafer plane are in opposite or complementary relationship to each other, and therefore cancel each other out insofar as a homogeneous intensity distribution occurs as the outcome in the wafer plane. As the deflection mirror 245 is arranged at least in the immediate proximity of a pupil plane of the illumination system, different angles on the deflection mirror 245 correspond to different locations in the field plane, that is to say in particular the reticle plane. That is utilized as the angle dependency of the reflectivity of the deflection mirror 245 is transformed into a field dependency which provides a suitable allowance in respect of field dependency of the projection objective 20.

Although the choice of the HR-layer on the deflection mirror 245 is a particularly suitable possible way of deliberately matching the polarization-dependent transmission curve of the illumination system, the disclosure is not limited thereto. In general, when matching the polarization-dependent transmission characteristic of the illumination system, the procedure can be such that a series connection of lenses respectively provided with AR-layers (AR-coatings) and optionally mirrors provided with HR-layers (HR-coatings) forms the underlying basis, wherein each lens or mirror surface forms a degree of freedom. The design can be so adapted that the desired configuration for the transmission characteristic in the illumination system is afforded. In that respect a loss in intensity is possibly also accepted as optimization is in relation to the above-mentioned polarization-dependent transmission characteristic and not maximum transmission.

In that respect it is generally sufficient for optimization to be effected in relation to a polarization-dependent transmission characteristic which is complementary to the projection objective, for example for p-polarized light (in the case of a radial polarization distribution) as for example, when switching over to s-polarized light (in relation to a tangential polarization distribution) in the illumination system—just as in the projection objective—a complementary configuration in respect of the dependency of the reflectivities $R_s$ and $R_p$ on the angle of incidence is afforded automatically as shown in FIG. 3 except for a constant offset.

Matching the illumination system and the projection objective to each other can also be effected in such a way that a non-homogeneous diattenuation which occurs in the illumination system is compensated or corrected in the projection objective. In that respect the above-mentioned diattenuation in the illumination system may in particular involve the effect which can often be observed and which is due to the fact that the AR-layers provide substantially a rotationally symmetrical configuration in respect of diattenuation whereas the HR-layers (for example on the deflection mirror in the zoom axicon system or the deflection mirror in the pupil plane of the REMA objective) present a constant, non-rotationally symmetrical configuration in respect of diattenuation so that the superimpositioning of the two contributions leads to an increase in diattenuation in certain (for example horizontal) regions of the pupil plane and a reduction in diattenuation in other (for example vertical) regions of the pupil plane. That effect, in conjunction for example with a quadrupole illumination setting, leads to a non-homogeneous intensity distribution of the light which is introduced in the reticle plane of the illumination system.

The above-described non-homogeneous distribution of diattenuation in the illumination system can now be the subject of correction allowance in the projection objective. That has the advantage that for example corrective allowance in the mask is not required.

The mirrors present in a catadioptric projection objective on the one hand are suitable for that purpose. The concept described however can basically also be embodied in a purely refractive projection objective insofar as more specifically corrective allowance is effected on the AR-layers of the lenses of the projection objective. In that respect in particular for embodying a corrective allowance in relation to the above-described non-homogeneous intensity distribution obtained in the illumination system, it is possible to make use of the fact that a lens near a pupil has a relatively large subaperture and produces a substantially rotationally symmetrical configuration in respect of diattenuation whereas a lens near the field has a relatively small subaperture and—because of the comparatively small illuminated component—produces a substantially constant configuration in respect of diattenuation, which is superimposed with the above-mentioned rotationally symmetrical configuration of the lenses near the pupil. Accordingly suitable matching of the lenses near the pupil and the field respectively or of the AR-layers provided thereon also makes it possible to set an opposite characteristic in respect of diattenuation relative to the illumination system.

Furthermore in general terms the lenses near the pupil in the projection objective can also be provided with an inverse diattenuation relative to the lenses near the pupil in the illumination system. In contrast the lenses near the field in the projection objective can be provided with an inverse diattenuation relative to the lenses near the field in the illumination system or relative to the mirrors in the illumination system (in that respect the aforementioned mirrors, in their relatively high, constant component of diattenuation, are comparable to the action of a lens near the field).

Figure 5:
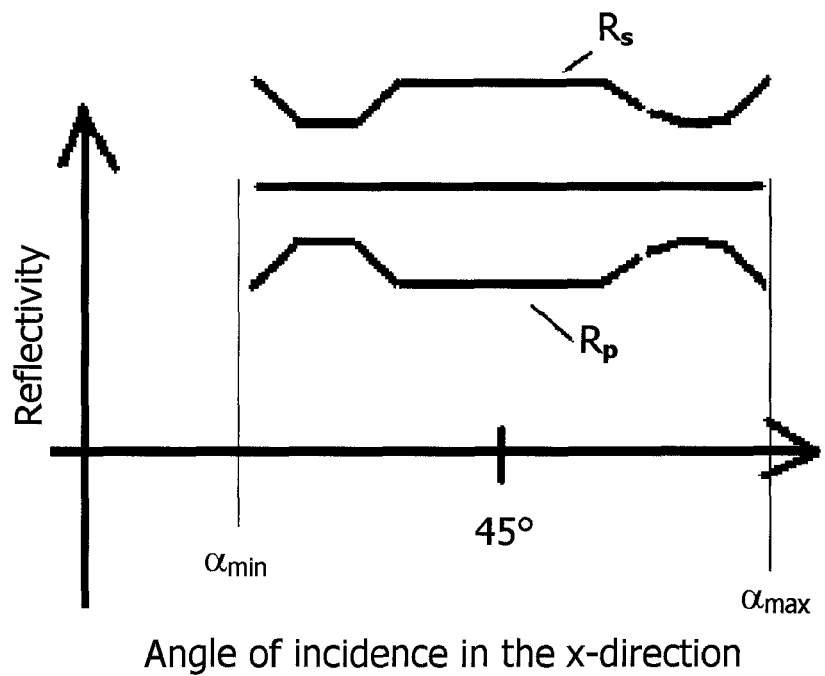
FIG. 5 shows a graph which illustrates a typical incidence angle dependency of the reflectivity of the deflection mirror in the illumination system of FIG. 2.
Figure 6:
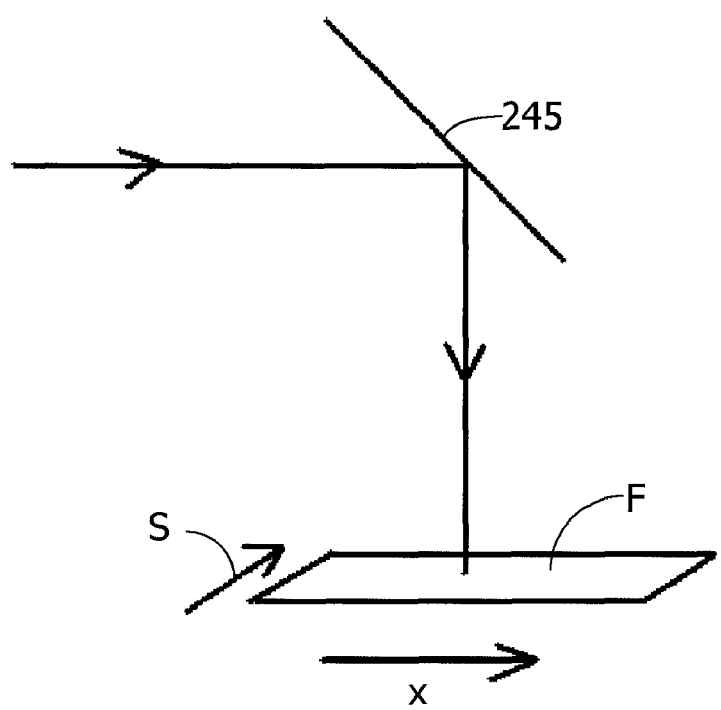
FIG. 6 shows a diagrammatic view of the relative arrangement of a deflection mirror and a reticle field in accordance with FIG. 5.

With reference to FIGS. 5 and 6, the reticle field F is rotated through 90° with respect to the arrangement described hereinbefore with reference to FIG. 2, thus giving the arrangement diagrammatically shown in FIG. 6. The lenses in front of and after the deflection mirror 245 have also been omitted from FIG. 6 for simplification purposes as it is only the relative position of the deflection mirror 245 with respect to the reticle field F that is to be considered. In that respect the longitudinal axis of the rectangle reticle field F (x-direction) extends perpendicularly to the axis of rotation about which the deflection mirror 245 is tilted or rotated. In other words, in FIG. 6, the longitudinal direction (x-direction) of the rectangular reticle field F extends in the same plane in which the deflection mirror 245 is also tilted, in which case the deflection mirror 245 involves the configuration, shown in FIG. 5, of the dependency of reflectivity on the angle of incidence in the x-direction.

The arrangement described with reference to FIGS. 5 and 6 has the advantage that, by virtue of the tilt of the deflection mirror 245 through 45°, the angles along the x-direction vary substantially more greatly in comparison with the FIG. 3 arrangement so that this affords greater matchability to the transmission properties of the projection objective. As a consequence of that greater variation in the angle of incidence, the layer design adopted for the HR-layer of the deflection mirror 245, relative to the FIG. 4 arrangement, can be of comparatively slight complexity.

Figure 7:
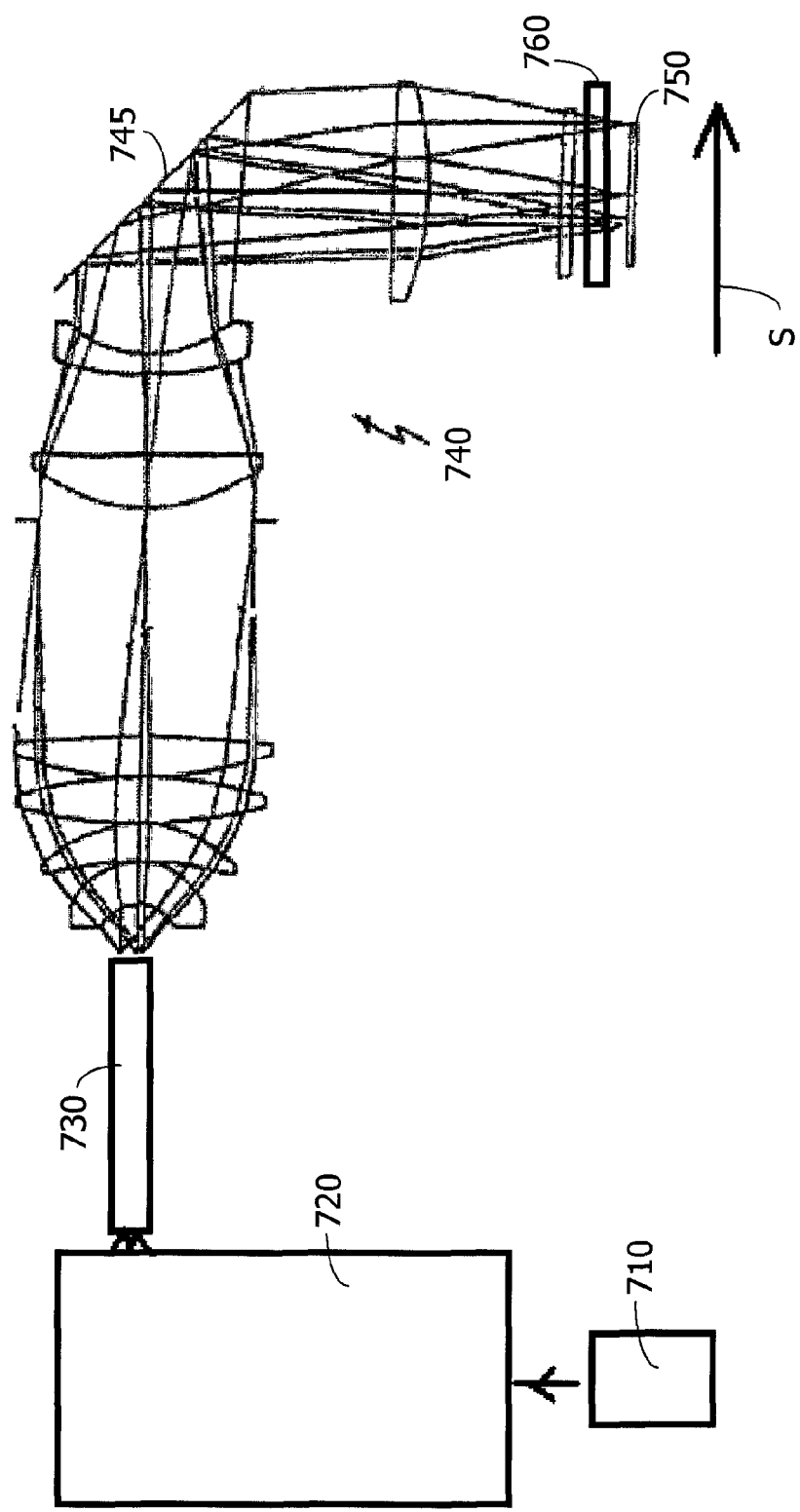
FIG. 7 shows a diagrammatic view of the structure of an illumination system to describe a further aspect for implementing the disclosure.

FIG. 7 shows a structure similar to FIG. 2 of an illumination system, wherein mutually corresponding or functional identical elements are denoted by references increased by 500.

As a difference in relation to the FIG. 2 arrangement, in FIG. 7 an additional optical element 760 is arranged immediately in front of the mask (reticle) 750, with respect to the light propagation direction. The optical element 760 effectively rotates the preferred polarization direction of linearly polarized light passing therethrough through 90°. Alternatively, the optical element can also be arranged immediately after the mask 750 with respect to the light propagation direction. In general, arranged between the illumination system and the projection objective is an additional optical element which causes effective rotation of the preferred polarization direction of linearly polarized light passing therethrough through 90°±3°.

The optical element 760 can be for example a lambda/2 plate of optically uniaxial material which is sufficiently translucent at the working wavelength used (for example 193 nm) (for example magnesium fluoride, MgF$_2$). In addition the optical element 760 can also be a plane plate of optically active material (for example crystalline quartz) in which the optical crystal axis is oriented parallel to the optical axis of the illumination system (referred to as an optical rotator) and the thickness of which is so selected that the preferred polarization direction of linearly polarized light passing therethrough is effectively rotated through 90° (that is to say generally through 90°+N*180°, wherein N is an integer greater than or equal to zero), by the effect of circular birefringence. When using synthetic, optically active crystalline material with a specific rotation capability of about 323.1° per millimeter at a wavelength of 193 nm and a temperature of 21.6° that condition corresponds to a thickness of the plane plate in question of about d≈(278.5+N*557) μm.

The consequence of the effective rotation of the preferred polarization direction through 90°, caused by the additional optical element 760, is that the perpendicular component of the electrical field strength vector is changed by light passing through the optical element 760 (that is to say the s-component) with the parallel component of the electrical field strength vector (that is to say the p-component), in relation to the system of the illumination system or the projection objective.

The consequence of using the additional optical element 760 shown in FIG. 7 is firstly that, instead of the polarization distribution in the illumination system, which is desired in the reticle plane having the mask 750, the correspondingly inverse or orthogonal polarization distribution has to be set. If therefore for example a tangential polarization distribution is wanted in the reticle plane, the light passing through the illumination system should have a radial polarization distribution, before the additional optical element 760, so that the desired tangential polarization distribution is the result after the effective rotation of the preferred polarization direction through 90° as a result of the action of the optical element 760.

In addition, with the structure adopted in FIG. 7, matching of the polarization-dependent transmission characteristic of the illumination system to that of the projection objective, unlike the situation with the structure of FIG. 2, is such that the polarization-dependent transmission characteristics, as shown in FIG. 7, are at least substantially identical (and thus not in mutually opposite or complementary relationship). Then, as a result, because of the action of the additional optical element 760 in the structure of FIG. 7 as also in the structure of FIG. 2, a homogeneous intensity distribution is achieved in the wafer plane.

In general, the effect of an unwanted characteristic present in the projection exposure apparatus, or a disturbance in the polarization properties, on the imaging result obtained in the photoresist, that is to say a polarization-induced intensity defect, is corrected via one or more correction elements which in turn set a defined intensity configuration. In specific terms, that is effected in that the intensity distribution on the reticle plane is deliberately 'detuned' in order to obtain a homogeneous intensity distribution in the image plane (that is to say on the photoresist-coated wafer).

A further application of the concept is described hereinafter. This involves compensation of a polarization-induced, linearly non-homogeneous configuration of intensity in the wafer plane. Such a linear component in a positionally dependent configuration is also referred to as the 'tilt' and occurs in particular when using polarized illumination settings in the illumination system.

Figure 16:
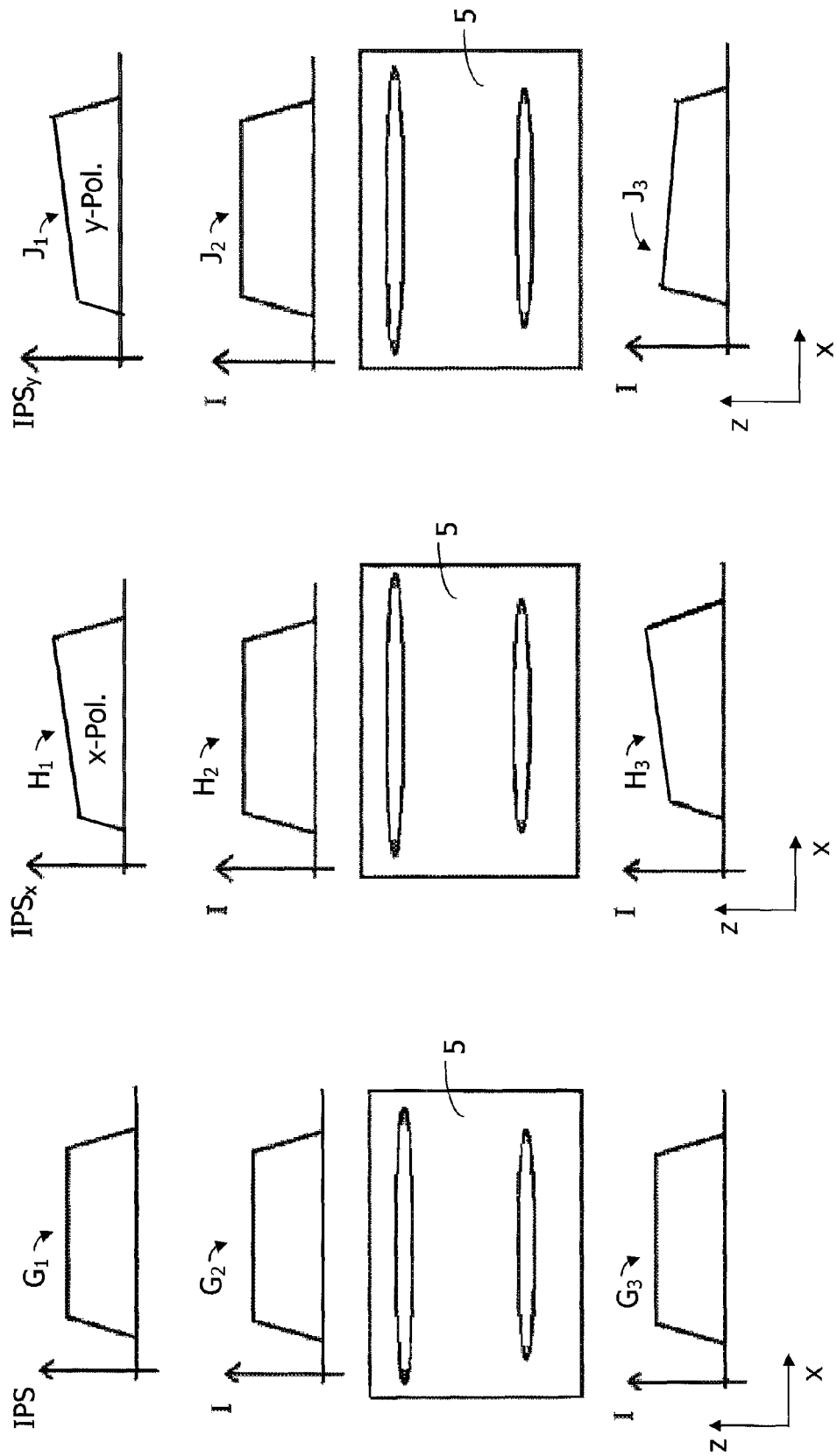

FIGS. 16*a-c* serve to explain that problem, FIG. 16*a* firstly showing an IPS distribution which is constant in the x-direction (as also in the y-direction) (curve $G_1$) and also a constant intensity distribution (curve $G_2$), for the case of setting unpolarized light over the reticle field. After passing through the projection objective 5, there is also a constant intensity distribution (curve $G_3$). Insofar as polarization effects occur they have no field configuration or at least a field configuration which is point-symmetrical about the field center in the wafer plane.

FIG. 16b is based on setting a linear polarization distribution with a preferred polarization direction in the x-direction ('x-polarization') and also constant intensity distribution. As shown in FIG. 16b the photons involve differing polarization over the reticle plane in the x-direction, which leads to a linear contribution to a local variation in the IPS distribution in the x-direction (curve $H_1$).

The projection objective 5, in conjunction with the light-sensitive layer on the wafer or the photoresist, acts like a weak polarizer and can therefore have a lesser degree of transmission for example for s-polarized light, than for p-polarized light. In that respect it is to be noted that the expression s-polarized light component is used to denote the light component with an orientation of the electrical field strength vector, that is perpendicular with respect to the plane of incidence, whereas the reference to p-polarized light component denotes the light component with an orientation of the electrical field strength vector, that is parallel to the plane of incidence. By way of example, in the case of what is referred to as a dipole-X-setting with y-polarization (that is to say a dipole illumination setting with illumination poles in mutually opposite relationship in the X-direction, within which the preferred polarization direction extends in the y-direction), there is almost exclusively s-polarized light, with respect to the surfaces in the projection objective.

The polarization distribution in the reticle plane is transformed into an intensity distribution which is obtained in the wafer plane and which accordingly also varies linearly in the x-direction (curve $H_3$) so that this results in an unwanted linear component in the scanned intensity perpendicularly to the scanning direction (assumed to be in the y-direction). Upon a change to y-polarization as shown in FIG. 16c that gives the corresponding reversed behaviour (curve $J_3$). As a consequence of that linear variation, operation of the exposure apparatus involves an unwanted variation in the imaging contrast over the image field.

As described hereinbefore, when the illumination system produces a linearly local variation in the IPS configuration with a constant intensity distribution in the reticle plane, after passing through the projection objective 5 there is a polarization-induced, linear local variation in the intensity distribution in the wafer plane. Now the action of that polarization-induced local variation is corrected in the illumination system, more specifically by the intensity distribution in the reticle plane being deliberately so set or 'detuned' that it counteracts the above-described, polarization-induced variation and thus at least partially compensates for same.

Setting of the intensity distribution on the reticle plane, as a departure from a homogeneous distribution (that is to say 'detuning' the intensity distribution) is achieved by arranging a dielectric plane plate of a suitable material with adequate transmission properties (for example quartz glass, $SiO_2$) in the illumination system, optionally in the pupil plane of the REMA objective, and tilting it through a defined angle relative to the optical axis OA of the illumination system. The effect of such a plane plate 810 is described for a non-tilted arrangement with reference to FIGS. 8-9 and for a tilted arrangement with reference to FIGS. 10-11.

Figure 8:
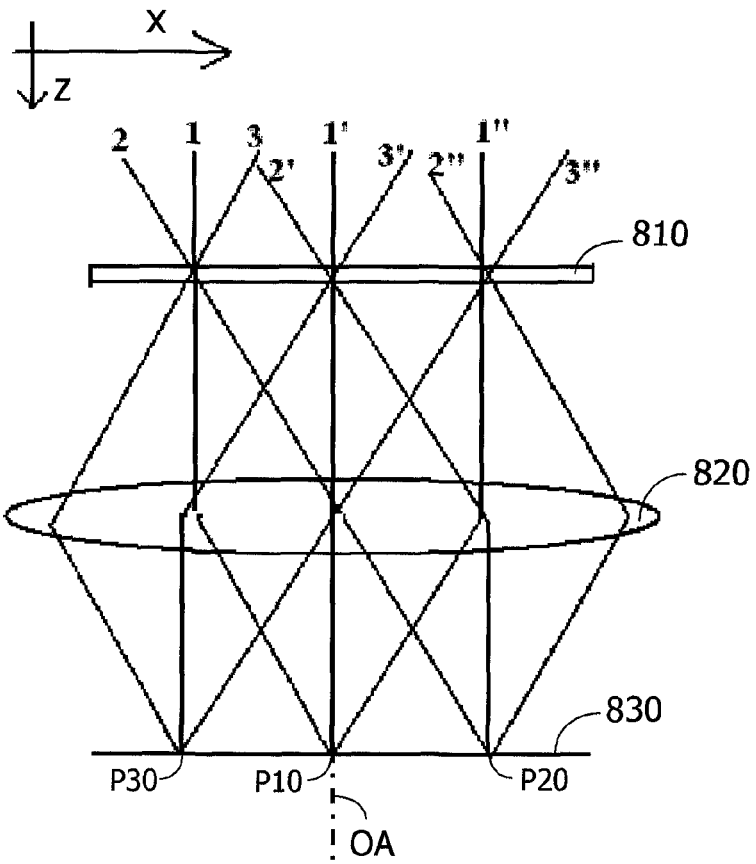
FIGS. 8-11 show diagrammatic views to explain the action of a correction element used in accordance with a further aspect of the disclosure in the illumination system for the correction of a polarization-induced, unwanted variation in the intensity distribution.
Figure 9A:
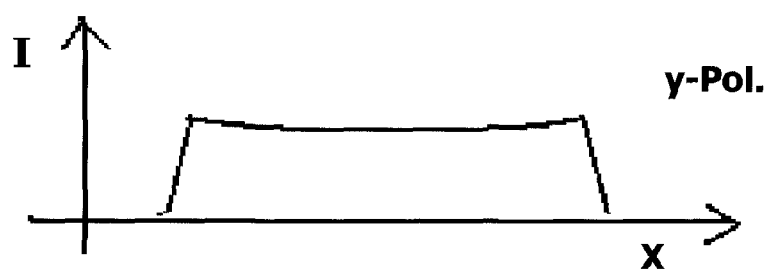
Figure 9B:
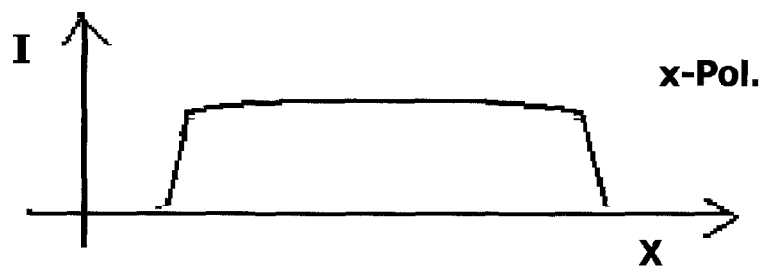

Referring to FIG. 8 which shows the non-tilted arrangement of the plane plate 801 in the pupil plane of the REMA objective (of which only one lens 820 is illustrated) all beams which issue from the pupil plane of the REMA objective at the same angle (for example the beams 1, 1', 1" or the beams 2, 2', 2") meet at the same field point in the reticle plane 830. As a consequence of the symmetrical arrangement in the pupil plane, in which for example the beams 2 and 3 encounter the plane plate 810 at the same angle of incidence so that those beams 2 and 3 produce the same intensity contribution at the impingement point in the reticle plane 830, as shown in FIGS. 9a-b that gives an intensity configuration which is symmetrical about the field center in the reticle plane 830.

Figure 10:
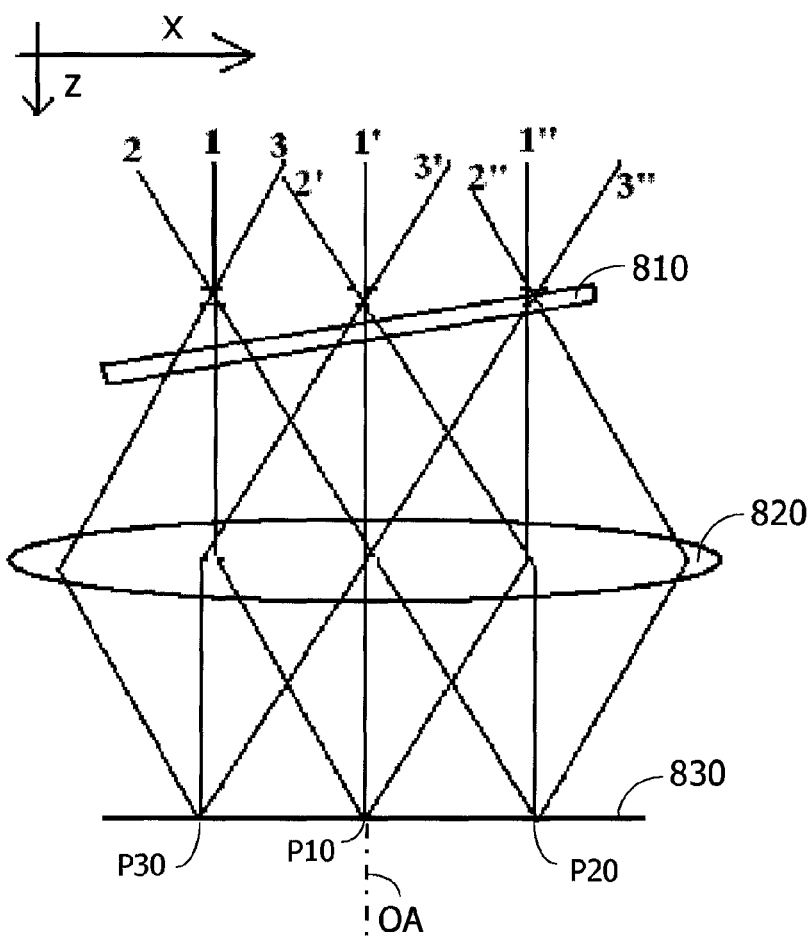

When the plane plate 810 is tilted as shown in FIG. 10 for example the angles of incidence of the beams 2 and 3 are different from each other. Transmission through the plane plate 810 is dependent on the polarization state and the angle of incidence of the beams in accordance with the Fresnel formulae. As transmission for example for the beams impinging on the point P20 in the reticle plane 830 are different from transmission for the beams impinging on the point P30 in the reticle plane 830, a linear local variation in the intensity configuration is produced in the reticle plane 830 due to the action of the plane plate 810 as shown in FIGS. 1a-b.

The plane plate 810 is made from a suitable dielectric material, for example quartz glass ($SiO_2$). The thickness of the plane plate 810 is typically less than 1 mm (e.g., less than 0.5 mm). The plane plate 810 can have a dielectric coating in order to minimise the effective transmission losses in the plane plate 810 by adjustment of the transmission characteristics for s- and p-polarized light, while maintaining the desired dependency of the transmission characteristic on polarization and angle of incidence of the light passing therethrough. A layer system by way of example, which is suitable as a dielectric coating on the plane plate 810, is specified in Table 1, wherein the thicknesses of the individual layers are respectively specified as the optical thickness (in FWOT units: FWOT='full wave optical thickness').

TABLE 1

| Optical thickness | Layer material |
|---|---|
| 0.54 | Chiolith |
| 0.22 | $LaF_3$ |
| 0.15 | Chiolith |
| 0.15 | $LaF_3$ |
| 0.15 | Chiolith |
| 0.22 | $LaF_3$ |
| 0.66 | Chiolith |
| 0.04 | $LaF_3$ |

Figure 12:
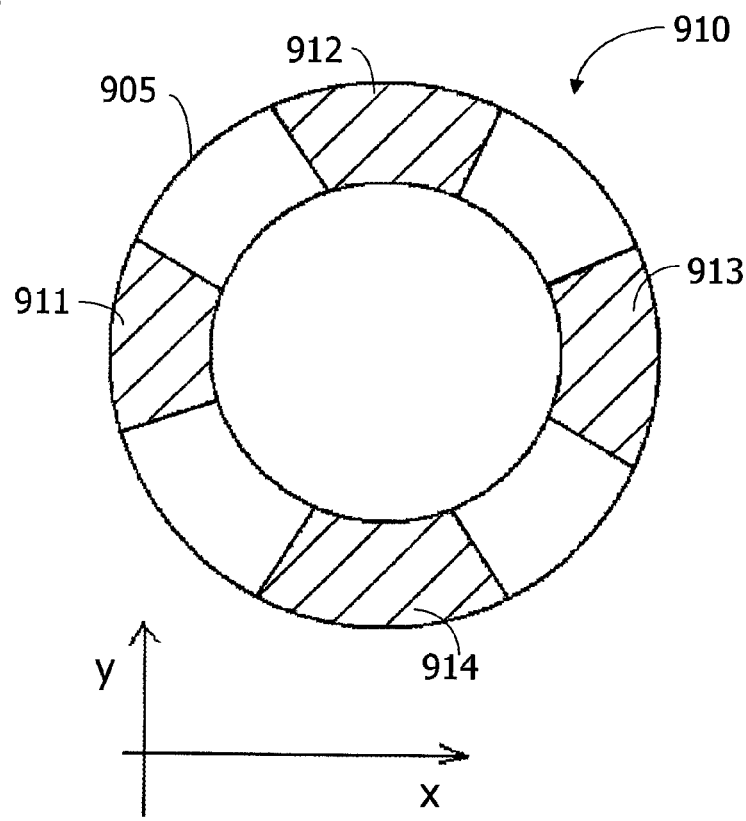
FIGS. 12a-b show diagrammatic views of a correction element.
Figure 12:
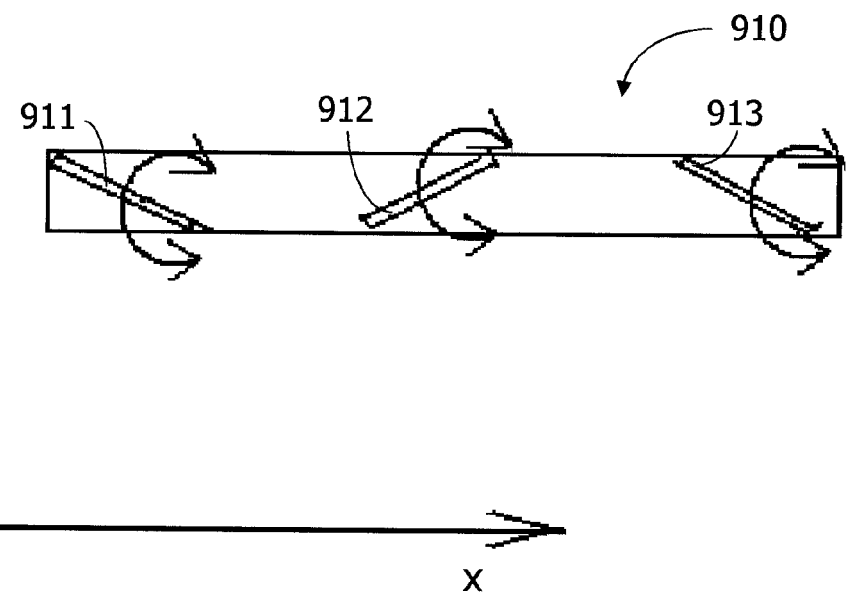

FIG. 12 shows a correction element 910 which is not in the form of a single plane plate but which is composed of a plurality of (in the example four) plane plates 911-914 arranged within a holder 905. That makes it possible to take account of the limited structural space in the z-direction as relatively large setting angles can be implemented as a consequence of the compact nature of the plane plates 911-914, without a large structural space in the z-direction being desired for that purpose. The configuration of the correction element 910 shown in FIG. 12 is also advantageous insofar as the effect, described hereinbefore with reference to FIG. 16, of a polarization-induced, linear, local variation in the intensity distribution obtained in the wafer plane occurs primarily in the outer regions of a dipole illumination setting. With the correction element 910 in FIG. 12, it is possible for a dipole-X-setting and a dipole-Y-setting to be taken into account independently of each other.

In that respect, suitable tilt angles (for example between −20° and +20°) can be set independently of each other for the individual plane plates 911-914 of the correction element 910 before installation of the correction element 910 in the illumination system. If necessary the correction element 910 can be removed from the illumination system or replaced as a whole. The individual plane plates 911-914 can each be of a thickness of typically 0.5 mm, a radial extent of 50 mm (corresponding to a quarter of the overall diameter of the correction element 910 of typically 200 mm) and a pole width of about 60°. In regard to the materials and any coatings on the plane plates 911-914, the foregoing description in relation to FIGS. 10-11 correspondingly applies.

Figure 14:
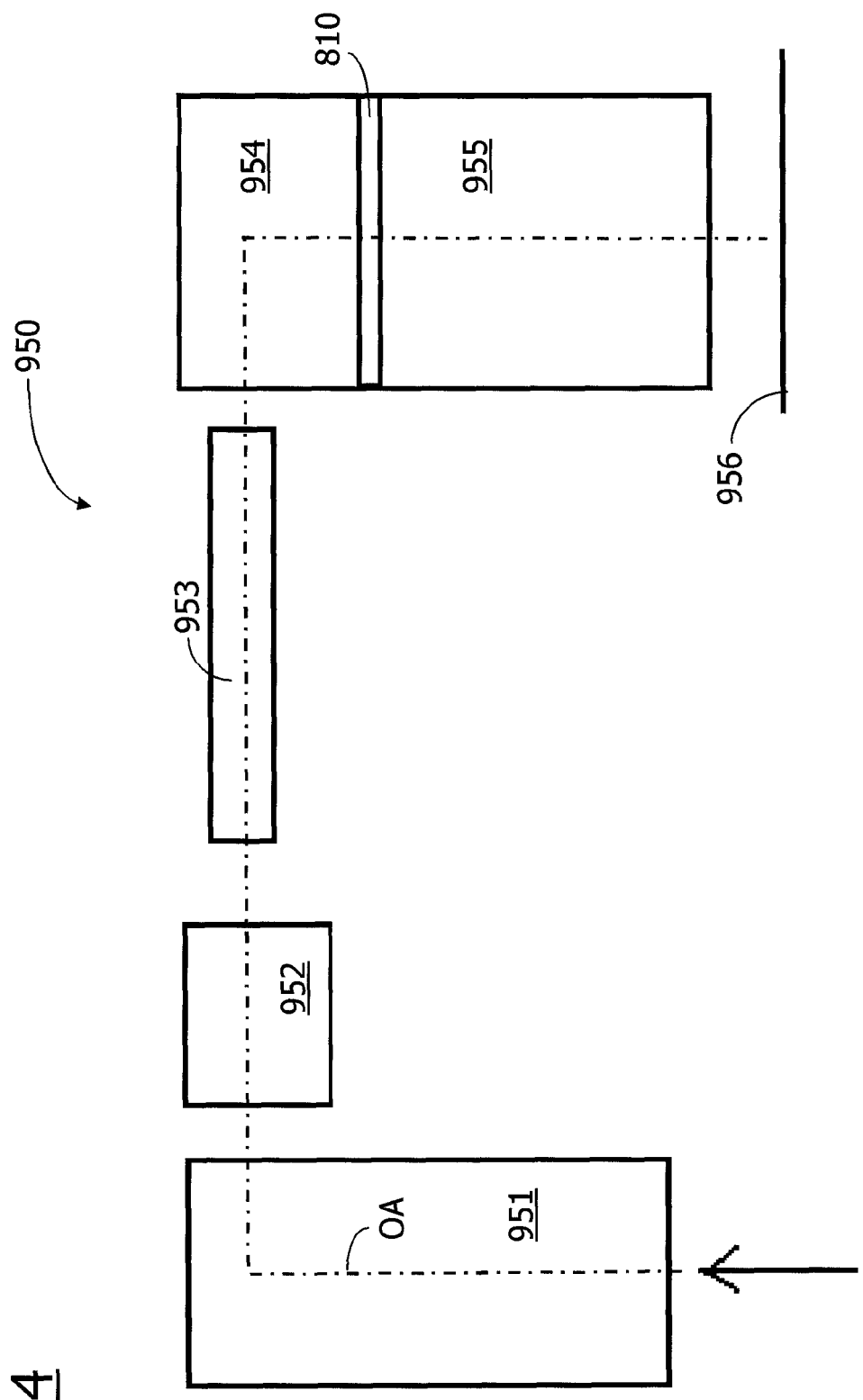
FIG. 14 shows an arrangement by way of example of a correction element.
Figure 15:
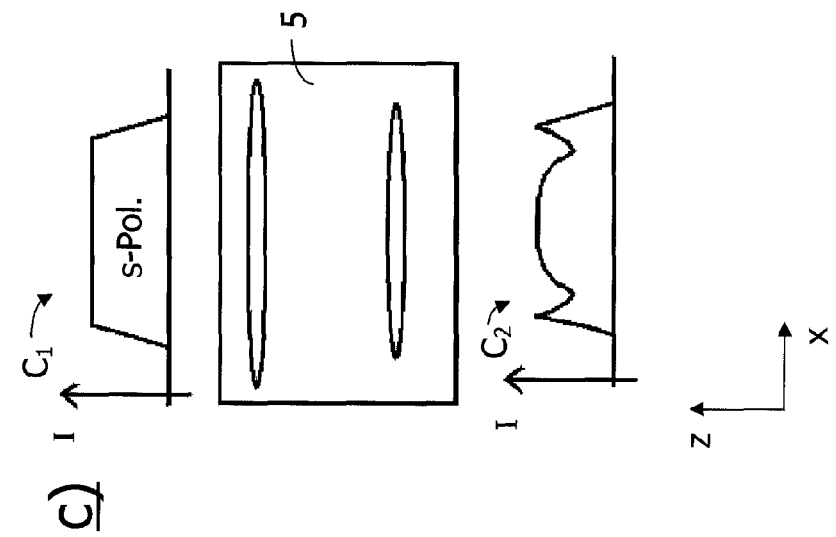
FIGS. 15a-c and FIGS. 16a-c show diagrammatic views of position-dependent intensity configurations in the reticle plane or in the wafer plane of a microlithographic projection exposure apparatus, for different polarization distributions, in accordance with the state of the art.
Figure 15:
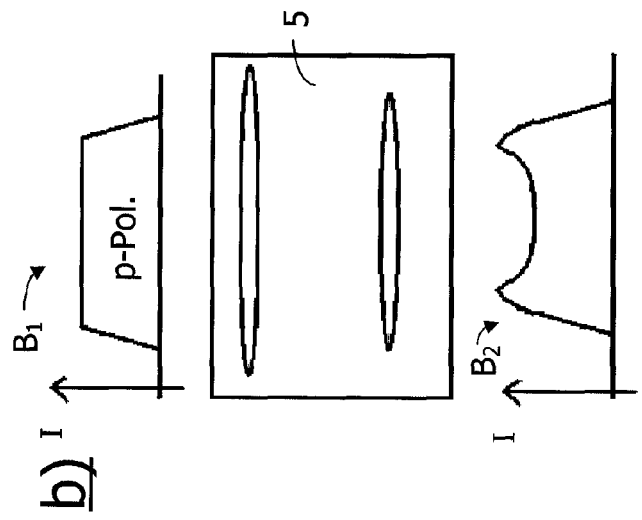
Figure 15:
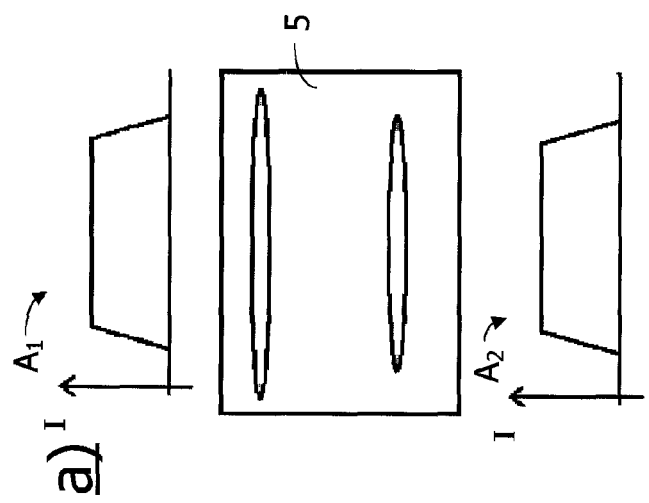

FIG. 14 is a diagrammatic simplified view showing an exemplary arrangement of a correction element 810 (or a correction element 910 as shown in FIG. 12) in the illumination system. As shown in FIG. 14 the illumination system 950 has a zoom axicon system 951, an optical coupling-in group 952, a light mixing device 953 (which is here only by way of example in the form of an integrator bar but which can also be designed in some other fashion, for example as a honeycomb condenser), and an REMA objective 954, the correction element 810 being arranged in a pupil plane within the REMA objective 954.

Figure 13:
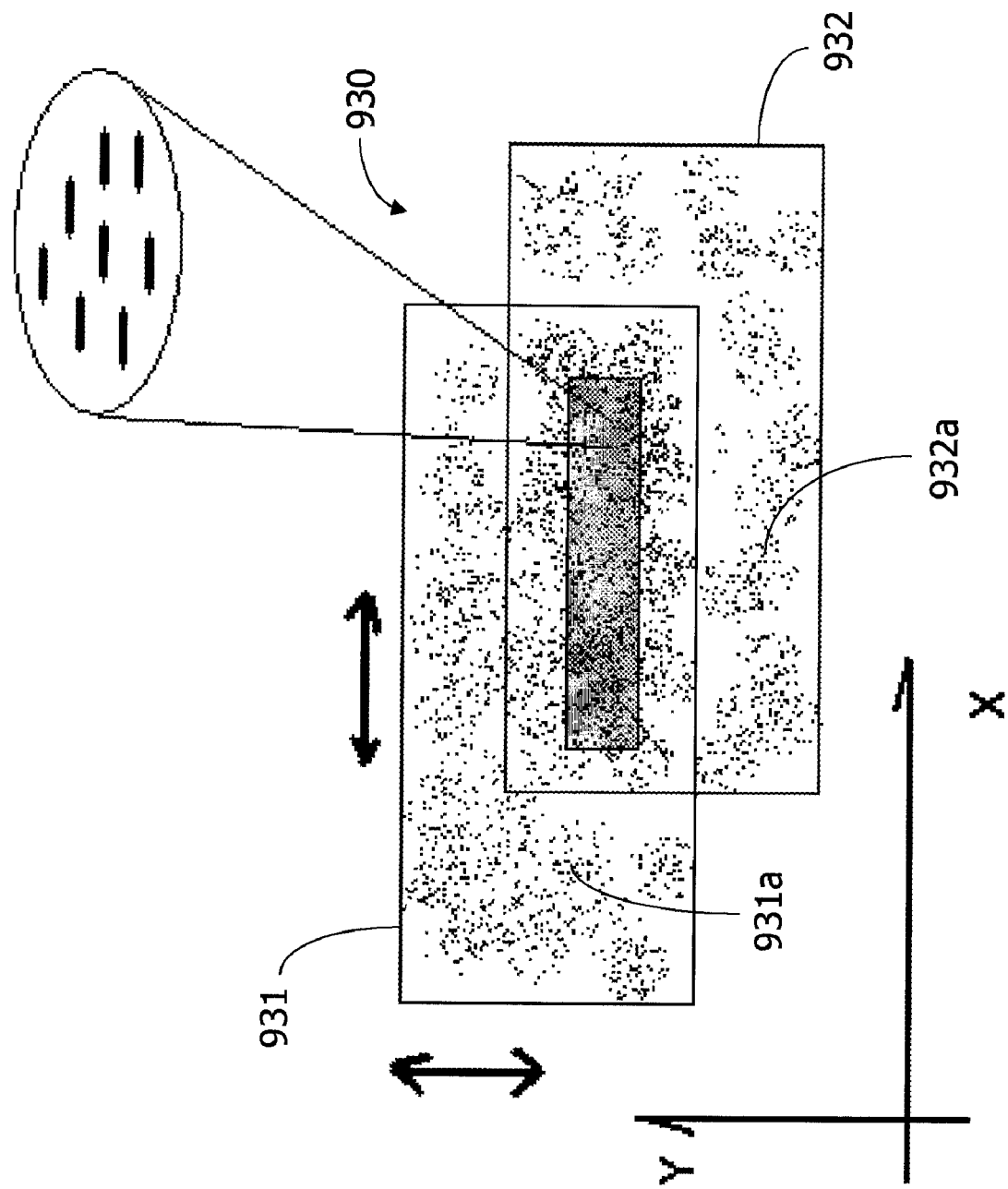
FIG. 13 shows an arrangement for modifying a field variation of intensity.

FIG. 13 shows an arrangement 930 (which also forms a correction element) to modify a field variation of the intensity. This modification of the field variation is (other than for a conventional gray filter) polarization-dependent, i.e. the effect of the arrangement 930 on the intensity distribution changes depending on the polarization. The arrangement 930 includes two plates 931, 932 made from e.g. fused silica ($SiO_2$), each of which being provided or coated with asymmetric structures 931a or 932a, respectively, the dimensions of which being in the range of the operation wavelength. These asymmetric structures 931a, 932a are shown as ellipsoidal regions or areas of e.g. an at least partially absorbent or at least partially reflective and optionally metallic material, such as chrome (Cr), wherein also for example aluminium (Al) or silicon (Si) are suitable materials. The plates 931, 932 are movable with respect to each other (e.g. by displacement of the plate 931 in direction of the double-headed arrows, i.e. in x-direction and/or y-direction in the coordinate system) with respect to the plate 932.

If the vector of the electrical field oscillates parallel to the larger axis of the structure (e.g. to the larger axis of the ellipse), this will result in a stronger correlation or interaction between the respective structure 931a, 932a and the electromagnetic irradiation. If, however, the vector of the electrical field oscillates perpendicular to the larger axis of the structure (e.g. the larger axis of the ellipse), this will result in a weaker correlation or interaction between the respective structure 931a, 932a and the electromagnetic irradiation. Exemplary (but not restrictive) dimensions of the ellipsoidal areas shown in FIG. 13 are a length of the smaller axis of the ellipse of 50 nm and a length of the larger axis of the ellipse of 200 nm. The degree of coverage with respect to the structures on the plates is selected dependent on the position and the desired absorption effect to be obtained for unpolarized light. In some embodiments, the coverage or coating can be realized as a grid polarizer.

According to some embodiments, the arrangement 930 is arranged at least in the immediate proximity of a field plane, in order to correct an intensity distribution caused by polarization effects in the field.

Even if the disclosure has been described by reference to specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the disclosure and the scope of the disclosure is limited only in the sense of the accompanying claims and equivalents thereof.

What is claimed is:

1. An apparatus, comprising:
an illumination system; and
a projection objective having an object plane and an image plane,
wherein:
the apparatus is a microlithography projection exposure apparatus; and
when light passes through the apparatus:
the illumination system illuminates the object plane of the projection objective;
the projection objective produces an image of the object plane of the projection objective on the image plane of the projection objective;
a polarization-dependent transmission is produced in the illumination system such that, for at least one polarization distribution of light impinging on the object plane, a non-homogeneous intensity distribution in the object plane of the projection objective is obtained;
the illumination system and the projection objective each have at least one polarization-sensitive optical element with a polarization-dependent transmission and/or reflection characteristic; and
a totality of the polarization-sensitive optical elements of the illumination system and a totality of the polarization-sensitive optical elements of the projection objective have mutually inverse diattenuations.

2. The apparatus of claim 1, wherein a homogeneous intensity distribution in the image plane of the projection objective is obtained when a reticle is not in the object plane of the projection objective.

3. The apparatus of claim 1, wherein the illumination system has an optical axis and a correction element comprising a plane plate is tilted relative to the optical axis.

4. The apparatus of claim 3, wherein the plane plate has a transmission characteristic dependent on a polarization state and an angle of incidence of light passing therethrough.

5. The apparatus of claim 3, wherein the apparatus has a scanning direction, and an axis of rotation about which the plane plate is tilted relative to the optical axis extends parallel to the scanning direction.

6. The apparatus of claim 3, wherein the plane plate has a dielectric coating.

7. The apparatus of claim 1, wherein the illumination system comprises a correction element comprising a plane plate, a material is on a surface of the plane plate, and the material is at least partially absorbent and/or at least partially reflective material at an operation wavelength of the apparatus.

8. The apparatus of claim 7, wherein the material forms asymmetric structures on the plane plate.

9. The apparatus of claim 8, wherein each of the asymmetric structures has a maximum dimension that is not larger than 1.5 times the operation wavelength of the apparatus.

10. The apparatus of claim 1, further comprising a correction element that comprises at least two plane plates.

11. The apparatus of claim 10, wherein the at least two plane plates are movable with respect to each other.

12. The apparatus of claim 10, wherein the at least two plane plates are adjustable independently of each other in respect of their tilt angle relative to an optical axis of the illumination system.

13. An apparatus, comprising:
an illumination system; and
a projection objective having an object plane and an image plane,
wherein:
the apparatus is a microlithography projection exposure apparatus; and
when light passes through the apparatus:
the illumination system illuminates the object plane of the projection objective;
the projection objective produces an image of the object plane of the projection objective on the image plane of the projection objective;
a polarization-dependent transmission is produced in the illumination system such that, for at least one polarization distribution of light impinging on the object plane, a non-homogeneous intensity distribution in the object plane of the projection objective is obtained;
the illumination system and the projection objective each have at least one polarization-sensitive optical element with a polarization-dependent transmission and/or reflection characteristic; and
a totality of the polarization-sensitive optical elements of the illumination system and a totality of the polarization-sensitive optical elements of the projection objective have mutually coincident diattenuations.

14. The apparatus of claim 13, further comprising an optical element between the illumination system and the projection objective, wherein when light passes through the apparatus the optical element causes an effective rotation of a preferred polarization direction of linearly polarized light passing therethrough through 90°±3°.

15. The apparatus of claim 13, wherein the polarization-sensitive optical elements are lenses provided with AR-layers or mirrors provided with HR-layers.

16. The apparatus of claim 1, wherein the illumination system comprises a deflection mirror.

17. The apparatus of claim 16, wherein the deflection mirror is in immediate proximity of a pupil plane.

18. The apparatus of claim 16, wherein the illumination system has an optical axis and during use illuminates a rectangular reticle field in the object plane of the projection objective, and a longitudinal axis of the rectangular reticle field is arranged at an angle of 90°±3° relative to an axis of rotation about which the deflection mirror is tilted relative to the optical axis.

19. The apparatus of claim 1, wherein at least one lens in the illumination system and/or the projection objective is provided with an anti-reflecting coating, for which $T_s$ is greater than $T_p$, wherein $T_p$ denotes the degree of transmission for the p-component and $T_s$ denotes the degree of transmission for the s-component of light impinging on the coating.

20. A method, comprising:
a) providing a microlithography projection exposure apparatus, comprising:
an illumination system; and
a projection objective having an object plane and an image plane,
wherein when light passes through the apparatus:
the illumination system illuminates the object plane of the projection objective;
the projection objective produces an image of the object plane of the projection objective on the image plane of the projection objective;
a polarization-dependent transmission is produced in the illumination system such that, for at least one polarization distribution of light impinging on the object plane, a non-homogeneous intensity distribution in the object plane of the projection objective is obtained;
the illumination system and the projection objective each have at least one polarization-sensitive optical element with a polarization-dependent transmission and/or reflection characteristic; and
a totality of the polarization-sensitive optical elements of the illumination system and a totality of the polarization-sensitive optical elements of the projection objective have mutually inverse diattenuations; and
b) using the microlithography projection exposure apparatus to manufacture microstructured components.

21. The method of claim 20, wherein the method comprises:
providing a substrate on which a layer of a light-sensitive material is at least partially applied;
providing a mask having structures to be reproduced; and
projecting at least a part of the mask on to a region of the layer via the microlithography projection exposure apparatus.

22. A method, comprising:
a) providing a microlithography projection exposure apparatus, comprising:
an illumination system; and
a projection objective having an object plane and an image plane,
wherein when light passes through the apparatus:
the illumination system illuminates the object plane of the projection objective;
the projection objective produces an image of the object plane of the projection objective on the image plane of the projection objective;
a polarization-dependent transmission is produced in the illumination system such that, for at least one polarization distribution of light impinging on the object plane, a non-homogeneous intensity distribution in the object plane of the projection objective is obtained;
the illumination system and the projection objective each have at least one polarization-sensitive optical element with a polarization-dependent transmission and/or reflection characteristic; and
a totality of the polarization-sensitive optical elements of the illumination system and a totality of the polarization-sensitive optical elements of the projection objective have mutually coincident diattenuations; and
b) using the microlithography projection exposure apparatus to manufacture microstructured components.

23. The method of claim 22, wherein the method comprises:
providing a substrate on which a layer of a light-sensitive material is at least partially applied;
providing a mask having structures to be reproduced; and
projecting at least a part of the mask on to a region of the layer via the microlithography projection exposure apparatus.

24. The apparatus of claim 13, wherein a homogeneous intensity distribution in the image plane of the projection objective is obtained when a reticle is not in the object plane of the projection objective.

25. The apparatus of claim 13, wherein the illumination system has an optical axis and a correction element comprising a plane plate is tilted relative to the optical axis.

26. The apparatus of claim 25, wherein the plane plate has a transmission characteristic dependent on a polarization state and an angle of incidence of light passing therethrough.

27. The apparatus of claim 25, wherein the apparatus has a scanning direction, and an axis of rotation about which the plane plate is tilted relative to the optical axis extends parallel to the scanning direction.

28. The apparatus of claim 25, wherein the plane plate has a dielectric coating.

29. The apparatus of claim 13, wherein the illumination system comprises a correction element comprising a plane plate, a material is on a surface of the plane plate, and the material is at least partially absorbent and/or at least partially reflective material at an operation wavelength of the apparatus.

30. The apparatus of claim 29, wherein the material forms asymmetric structures on the plane plate.

31. The apparatus of claim 30, wherein each of the asymmetric structures has a maximum dimension that is not larger than 1.5 times the operation wavelength of the apparatus.

32. The apparatus of claim 13, further comprising a correction element that comprises at least two plane plates.

33. The apparatus of claim 32, wherein the at least two plane plates are movable with respect to each other.

34. The apparatus of claim 32, wherein the at least two plane plates are adjustable independently of each other in respect of their tilt angle relative to an optical axis of the illumination system.

* * * * *

UNITED STATES PATENT AND TRADEMARK OFFICE
CERTIFICATE OF CORRECTION

| | |
|---|---|
| PATENT NO. | : 7,817,250 B2 |
| APPLICATION NO. | : 12/146200 |
| DATED | : October 19, 2010 |
| INVENTOR(S) | : Damian Fiolka et al. |

Page 1 of 1

It is certified that error appears in the above-identified patent and that said Letters Patent is hereby corrected as shown below:

Column 1, line 1, delete "10 2007 033 733.8" insert --10 2007 033 773.8--.

Column 6, line 27, delete "element," insert --element.--.

Figure 11A:
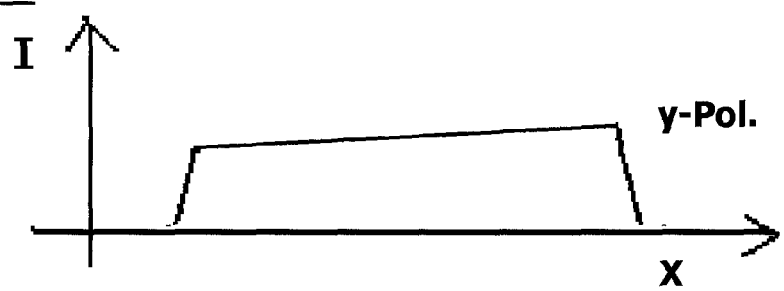
Figure 11B:
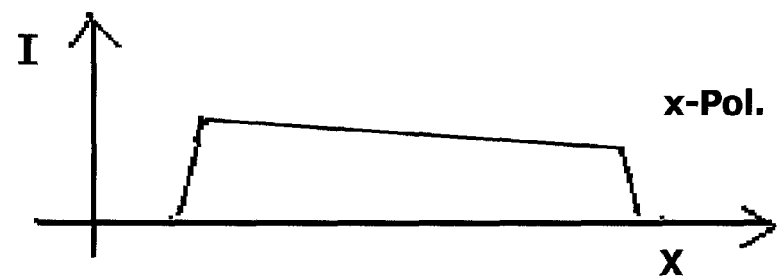

Column 12, line 21, delete "FIGS, 1a-b." insert --FIGS 11a-b.--.

Signed and Sealed this
Fourth Day of January, 2011

David J. Kappos
*Director of the United States Patent and Trademark Office*